United States Patent [19]

Moon

[11] 4,380,828

[45] Apr. 19, 1983

[54] UHF MOSFET MIXER

[75] Inventor: Frederick H. Moon, Mount Prospect, Ill.

[73] Assignee: Zenith Radio Corporation, Glenview, Ill.

[21] Appl. No.: 267,136

[22] Filed: May 26, 1981

[51] Int. Cl.$^3$ ............................................. H04B 1/26
[52] U.S. Cl. .................................... 455/319; 455/323; 455/333
[58] Field of Search ............... 455/150, 179, 195, 198, 455/318–320, 323, 333; 334/15

[56] References Cited

U.S. PATENT DOCUMENTS

| | | | |
|---|---|---|---|
| 2,282,861 | 5/1942 | Gardiner | 455/319 |
| 3,237,106 | 2/1966 | Ghaem-Maghami | 455/198 |
| 3,643,168 | 2/1972 | Manicki | 455/195 |
| 4,048,598 | 9/1977 | Knight | . |
| 4,145,659 | 3/1979 | Wolfram | 334/15 |
| 4,313,222 | 1/1982 | Katthan | 455/319 |

Primary Examiner—Jin F. Ng
Attorney, Agent, or Firm—Jack Kail

[57] ABSTRACT

A UHF television receiver tuner comprises a varactor tuned circuit coupled to an input electrode of a field effect transistor mixer through a serially connected RF coupling capacitor. A local oscillator signal is coupled to the input electrode of the field effect transistor mixer through an inductive loop whose inductance value is chosen such that proper impedance matching over the UHF band is achieved.

8 Claims, 1 Drawing Figure

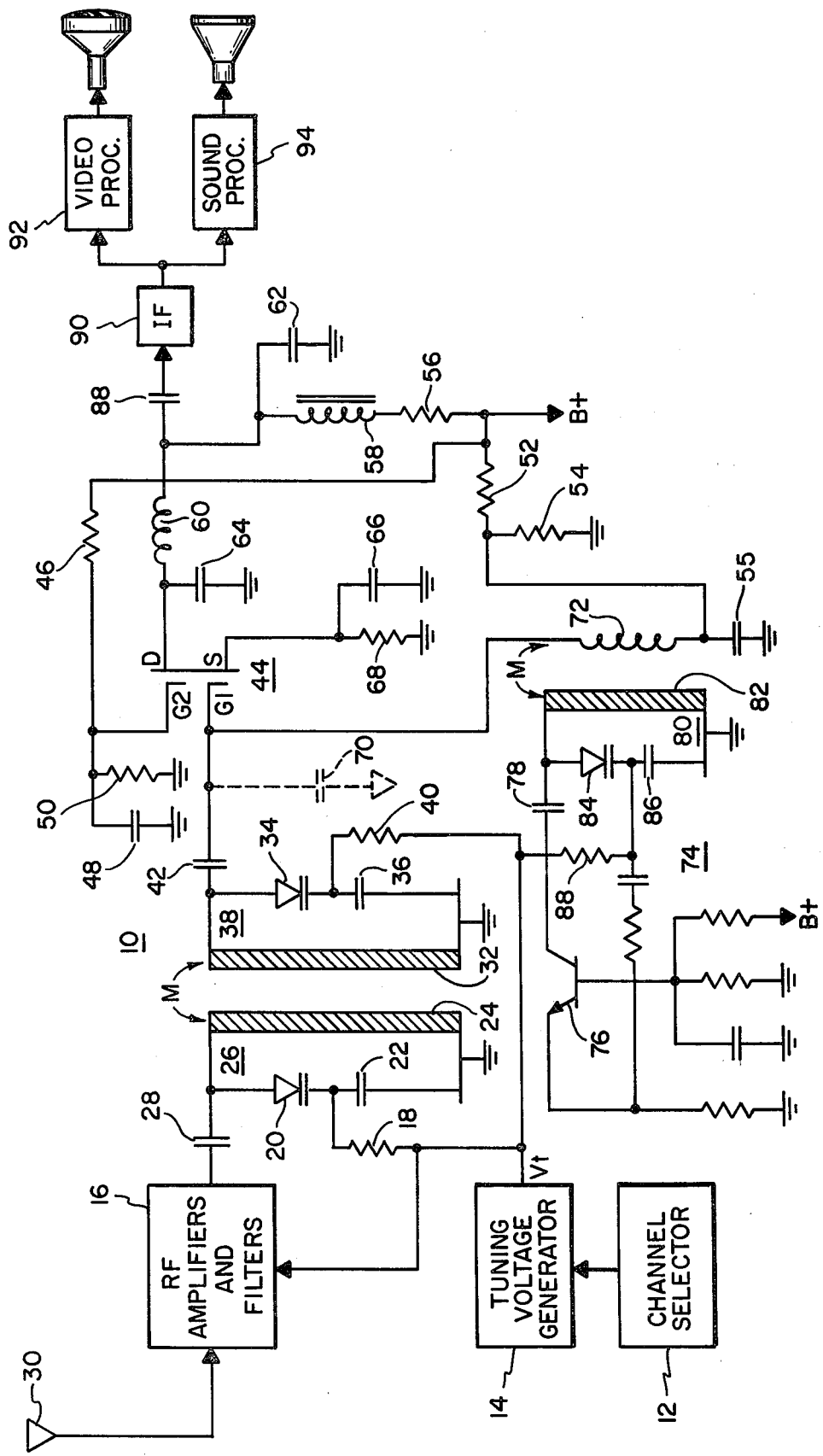

UHF MOSFET MIXER

BACKGROUND OF THE INVENTION

The present invention relates generally to improvements in television receiver tuner circuits and, more particularly to a television receiver UHF tuner circuit incorporating a MOSFET (metal oxide semiconductor field effect transistor) mixer.

A superheterodyne UHF tuning circuit for a television receiver typically comprises a tunable RF amplifier connected for coupling received UHF television signals through one or more filter circuits to the input of a mixer device. An appropriate local oscillator signal is also coupled to the input of the mixer where it is heterodyned or beat with the received radio frequency UHF television signal to develop an intermediate frequency signal for subsequent processing by the television receiver. UHF mixing devices normally comprise hot carrier diodes which impose a limitation on a large signal handling capability of the UHF tuning circuit due to cross-modulation and intermodulation interference.

Improvements in UHF channel reception for television receivers can be achieved by replacing the hot carrier diode mixer in the UHF tuner circuit with an improved mixing device such as a MOSFET. The use of MOSFET mixer in a UHF television tuner circuit results in an improvement in large signal handling capability while minimizing RF interference caused by cross-modulation and intermodulation. In addition, the use of a MOSFET mixer enables the realization of a conversion gain rather than a conversion loss as in the case of a hot carrier diode mixer. Furthermore, by virtue of the unilateral active device characteristics of a MOSFET, especially a dual-gate MOSFET, and the reduced input/output impedance variations of the MOSFET in response to variations in local oscillator pumping power, more consistent bandpass characteristics of both the RF and IF filtering circuits can be achieved to enhance the overall selectivity of the receiver and to reduce its susceptibility to RF interference.

Heretofore, various limitations have militated against the use of field effect transistors, e.g. MOSFET's, in UHF television receiver tuning circuits, especially those tuning circuits incorporating varactor diode tuning elements. In particular, the rather large parasitic input capacitance of the MOSFET together with the additional circuit capacitance introduced by the conventional capacitive coupling of the local oscillator signal to the mixer results in an insufficient tuning range across the UHF band. Also, relatively poor RF bandpass characteristics are achieved due to the mismatch between the tuning resonance of the MOSFET and the other resonant circuits of the tuner. Furthermore, due to the mismatch between the relatively high input impedance of the field effect transistor mixer, and the relatively low impedance of the varactor tuned circuit typically coupled to the input thereof, especially at the low end of the UHF band, satisfactory conversion gain over the entire UHF band cannot be achieved using conventional techniques for coupling the RF and local oscillator signals to the input of a field effect transistor mixer.

U.S. Pat. No. 4,048,598 teaches the use of an impedance transformation network, comprising a series connected capacitor and a shunt connected inductor, to achieve a proper impedance match between a varactor tuned circuit and a field effect transistor amplifier to increase the signal power transferred therebetween at the low end of the UHF band. Co-pending application Ser. No. 200,806, filed Oct. 27, 1980 now U.S. Pat. No. 4,363,135 and assigned to the assignee of the present invention, teaches the use of a bandswitchable impedance transformation network connected between a varactor tuned circuit and a field effect transistor used as a VHF mixer. However, neither of these teachings addresses the problem of using a field effect transistor as a UHF mixer nor the associated problem of devising a satisfactory method for coupling a local oscillator signal to the input of a field effect transistor UHF mixer.

It is accordingly a basic object of the present invention to provide an improved UHF tuner for use in a television receiver.

It is another object of the invention to provide an improved UHF tuner for use in a television receiver, which UHF tuner includes a field effect transistor mixer.

It is a further object of the invention to provide an improved UHF tuner for use in a television receiver, which UHF tuner includes a field effect transistor mixer and a novel circuit arrangement for coupling a local oscillator signal to the input of the field effect transistor mixer.

In accordance with one aspect of the present invention, a television receiver UHF tuning circuit includes a varactor tuned circuit coupled to an input electrode of a field effect transistor mixer through a serially connected RF coupling capacitor, a local oscillator signal being coupled to the input electrode of the field effect transistor mixer through an inductive loop whose inductance value is chosen such that proper impedance matching over the UHF band, and especially at the low end of the band, is achieved.

In accordance with another aspect of the invention, by selecting the RF coupling capacitor and the inductive local oscillator coupling loop to provide, in conjunction with the input parasitic capacitance of the field effect transistor mixer, a resonant frequency below the lowest frequency in the UHF band, local oscillator power coupling is achieved without capacitively loading the input electrode of the field effect transistor mixer enabling the varactor tuned circuit to achieve a satisfactory tuning range and proper tracking in relation to the other circuits of the tuner.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawing which is an electrical diagram, partly in schematic form and partly in block diagram form, illustrating the presently preferred embodiment of the invention.

DESCRIPTION OF THE PREFERRED EMBODIMENT

Referring to the drawing, there is illustrated a television receiver including a UHF tuning circuit 10 according to the present invention, UHF tuning circuit 10 being adapted for tuning television channels 14–83 transmitted within the UHF band of frequencies extending between 470 and 890 MHz.

The television receiver includes a conventional channel selector 12 operable by the viewer for identifying a selected UHF television channel, channel selector 12 in turn operating a tuning voltage generator 14 for developing an output tuning voltage signal $V_t$ representing the selected UHF channel. The tuning voltage signal $V_t$ is coupled to the input of an RF amplifier and filter stage 16 and also through a resistor 18 to the junction formed between a varactor diode 20 and a capacitor 22. The series combination of varactor diode 20 and capacitor 22 are connected in parallel with a UHF resonant line 24 so as to form a resonant circuit 26 resonant at the frequency of the RF video carrier of the selected UHF channel in response to the tuning voltage signal $V_t$. RF amplifier and filter stage 16, which is capacitively coupled to resonant circuit 26 by a capacitor 28, includes a number of similar resonant circuits such that only the selected UHF television signal is coupled from a receiving antenna 30 to resonant circuit 26. The RF signal developed by resonant circuit 26 is magnetically coupled from UHF resonant line 24 to a second UHF resonant line 32 forming together with a varactor diode 34 and a capacitor 36 a further resonant circuit 38. The output of resonant circuit 38, which is also tuned to the RF video carrier of the selected television channel by means of a resistor 40 connected to the output of tuning voltage generator 14, is coupled by a capacitor 42 to a first input gate electrode G1 of a mixer dual gate MOSFET 44. MOSFET 44 may comprise, for example, part number BF960 manufactured by Siemens AG. The second gate G2 of MOSFET 44 is connected to a source of biasing potential B+ through a resistor 46 and also to ground potential through the parallel combination of a bypass capacitor 48 and a resistor 50. Biasing potential B+ is additionally connected through a pair of resistors 52 and 54 and a capacitor 55 to ground potential and also through a resistor 56, a choke 58 and an inductor 60 to the drain of MOSFET 44, the junctions formed between inductor 60 and choke 58 and the drain of MOSFET 44 being coupled to ground by capacitors 62 and 64 respectively. The source of MOSFET 44 is connected to ground by the parallel combination of a bypass capacitor 66 and a resistor 68.

As explained in the previously mentioned patent, MOSFET 44 exhibits a relatively large parasitic capacitance, represented by dotted line capacitance 70 which, especially at the low end of the UHF band, contributes to an impedance mismatch between the input of the MOSFET and resonant circuit 38 reducing the conversion gain of the MOSFET at these frequencies when used as a mixer. In order to overcome this problem a peaking inductor 72 is connected between capacitor 55 and gate G1 of MOSFET 44, peaking inductor 72 and coupling capacitor 42 forming an impedance transformation network for equalizing the conversion gain of MOSFET mixer 44. In particular, conversion gain equalization of MOSFET mixer 44 is achieved by selecting capacitor 42 and peaking inductor 72 such that, in conjunction with input parasitic capacitance 70, a resonant point is established slightly below the UHF range of frequencies, e.g. between 350–400 MHz, whereby an approximate impedance match is established over the UHF range.

UHF tuning circuit 10 further includes a local oscillator stage 74 comprising a common-base transistor 76 and associated biasing circuitry, the collector of transistor 76 being coupled by a capacitor 78 to a local oscillator resonant circuit 80. Local oscillator resonant circuit 80 comprises a UHF resonant line 82 connected in parallel with the series combination of a varactor diode 84 and a capacitor 86, the common junction between varactor diode 84 and capacitor 86 being coupled through a resistor 88 to tuning voltage generator 14. Local oscillator resonant circuit 80 is thereby responsive to the tuning voltage $V_t$ and cooperative with transistor 76 and its associated biasing circuitry for developing a local oscillator signal in proper relationship with the selected UHF channel for producing fixed intermediate frequency sound and picture carrier signals when heterodyned with the selected RF television signal. In accordance with the present invention, UHF resonant line 82 of local oscillator resonant circuit 80 is disposed in magnetically coupled relation with peaking coil 72 such that the local oscillator signal is magnetically coupled from UHF resonant line 82 to peaking coil 72 and therefrom to gate G1 of MOSFET 44. Magnetic loop coupling of the local oscillator signal to the MOSFET mixer in this manner results in efficiencies of both circuit fabrication, i.e. a minimum number of components are required to effect the coupling without adding undesirable stray circuit capacitance, and circuit operation, i.e. the achievement of high conversion gain with proper selection of peaking coil inductance, satisfactory tuning range and RF tracking and improved oscillator harmonic suppression at the mixer input as compared to capacitive oscillator coupling.

In accordance with the foregoing, MOSFET mixer 44 is operative for mixing or beating the RF television signal coupled to its input gate electrode G1 by capacitor 42 with the local oscillator signal derived from peaking coil 72 to produce the sound and picture intermediate frequency signals at its drain electrode. The intermediate frequency signals are subsequently applied through the single tuned intermediate frequency output circuit consisting of inductor 60 and capacitors 62 and 64 and a coupling capacitor 88 to an IF stage 90, the output of IF stage 90 being suitable for processing by the video and sound processing circuits 92 and 94 of the receiver.

While a particular embodiment of the invention has been shown and described, it will be apparent that changes and modifications may be made therein without departing from the invention in its broader aspects. For example, while the mixer of the present invention is embodied as a dual gate MOSFET, it will be appreciated that other field effect transistor devices can also be used. The aim of the appended claims, therefore, is to cover all such changes and modifications as fall within the true spirit and scope of the invention.

What is claimed is:

1. In a UHF television receiver tuner, the improvement comprising:
   a tuned circuit including a varactor diode;
   a mixer field effect transistor having an input gate electrode characterized by an input parasitic capacitance;
   capacitance means coupled in series between said input gate electrode and said tuned circuit;
   inductance means coupled in shunt between said input gate electrode and a point of reference potential and having a value of inductance for providing, in association with said capacitance means and with the input parasitic capacitance of said field effect transistor a resonant frequency below the lowest channel frequency in the UHF frequency band; and means developing and coupling a local oscillator signal to the input gate electrode of said mixer field effect transistor via said inductance means.

2. The improvement according to claim 1 wherein said coupling means comprises means for magnetically coupling said local oscillator signal for development across said inductance means.

3. In a UHF television receiver tuner, the improvement comprising:
   channel selection means operable for identifying a selected UHF television channel;
   a tuned circuit including a varactor diode, said tuned circuit being responsive to said channel selection means for developing the RF television signal broadcast on said selected UHF television channel;
   a mixer field effect transistor having an input gate electrode and an output electrode and characterized by an input parasitic capacitance;
   capacitance means coupled in series between said input gate electrode and said tuned circuit;
   inductance means coupled in shunt between said input gate electrode and a point of reference potential and having a value of inductance for providing, in association with said parasitic capacitance and with said capacitance means, a resonant frequency below the lowest channel frequency of the UHF television band; and
   local oscillator means responsive to said channel selection means for developing a local oscillator signal having a predetermined relationship to said developed RF television signal, and local oscillator means including means for magnetically coupling said local oscillator signal to said inductance means, whereby said mixer field effect transistor is operative for beating said developed RF signal with said local oscillator signal for producing an intermediate frequency signal on said output electrode.

4. The improvement according to claim 3 wherein said local oscillator means comprises a local oscillator resonant circuit including a resonant line disposed in magnetically coupled relation with said inductance means.

5. In a UHF television receiver tuner, the improvement comprising:
   a tuned circuit including a varactor diode;
   a mixer field effect transistor having an input gate electrode characterized by an input parasitic capacitance;
   impedance transformation means interposed between said tuned circuit and said input gate electrode, said impedance transformation means including an inductive component connected to said input gate electrode and a capacitive component resonant with said inductive component and with the input parasitic capacitance of said field effect transistor at a frequency below the lowest channel frequency in the UHF frequency band; and
   means developing and magnetically coupling a local oscillator signal for development across the inductive component of said impedance transformation means.

6. The improvement according to claim 5 wherein said developing and coupling means comprises a local oscillator resonant circuit including a resonant line disposed in magnetically coupled relation with the inductive component of said impedance transformation means.

7. In a UHF television receiver tuner, the improvement comprising:
   a tuned circuit including a varactor diode;
   a mixer field effect transistor having an input gate electrode characterized by an input parasitic capacitance;
   impedance transformation means interposed between said tuned circuit and said input gate electrode, said impedance transformation means including an inductive component connected to said gate electrode and a capacitive component resonant with said inductive component and with the input parasitic capacitance of said field effect transistor at a frequency below the lowest channel frequency in the UHF frequency band; and
   means coupling a local oscillator signal to the input gate electrode of said mixer field effect transistor via said inductive component.

8. The improvement according to claim 7 wherein said coupling means comprises means for magnetically coupling said local oscillator signal for development across said inductive component.

* * * * *